(12) United States Patent
Liu et al.

(10) Patent No.: US 8,785,307 B2
(45) Date of Patent: Jul. 22, 2014

(54) METHOD OF FORMING A MEMORY CELL BY REDUCING DIFFUSION OF DOPANTS UNDER A GATE

(75) Inventors: Xian Liu, Sunnyvale, CA (US); Mandana Tadayoni, Cupertino, CA (US); Chien-Sheng Su, Saratoga, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 120 days.

(21) Appl. No.: 13/593,448

(22) Filed: Aug. 23, 2012

(65) Prior Publication Data

US 2014/0057422 A1  Feb. 27, 2014

(51) Int. Cl.
*H01L 21/04* (2006.01)
(52) U.S. Cl.
USPC .................. 438/510; 438/289; 257/E21.618
(58) Field of Classification Search
CPC .............. H01L 27/115; H01L 27/11807
USPC .............. 438/510, 289, 283; 257/E21.618, 257/E21.619
See application file for complete search history.

(56) References Cited

U.S. PATENT DOCUMENTS

| 5,712,814 | A | 1/1998 | Fratin et al. |
| 6,747,310 | B2 | 6/2004 | Fan et al. |
| 7,868,375 | B2 | 1/2011 | Liu et al. |
| 7,927,994 | B1 | 4/2011 | Liu et al. |
| 2002/0109179 | A1* | 8/2002 | Johnson et al. ............... 257/314 |
| 2004/0065917 | A1* | 4/2004 | Fan et al. ...................... 257/315 |
| 2005/0124102 | A1 | 6/2005 | Wang et al. |
| 2007/0217267 | A1* | 9/2007 | Wong et al. ............. 365/185.33 |
| 2008/0124858 | A1 | 5/2008 | Nguyen et al. |
| 2009/0039410 | A1 | 2/2009 | Liu et al. |
| 2011/0127599 | A1 | 6/2011 | Liu et al. |

OTHER PUBLICATIONS

PCT Search Report and Written Opinion dated Feb. 7, 2014 corresponding to the related PCT Patent Application No. US13/52457.

* cited by examiner

*Primary Examiner* — Caridad Everhart
(74) *Attorney, Agent, or Firm* — DLA Piper LLP (US)

(57) ABSTRACT

A method of forming a memory cell includes forming a conductive floating gate over the substrate, forming a conductive control gate over the floating gate, forming a conductive erase gate laterally to one side of the floating gate and forming a conductive select gate laterally to an opposite side of the one side of the floating gate. After the forming of the floating and select gates, the method includes implanting a dopant into a portion of a channel region underneath the select gate using an implant process that injects the dopant at an angle with respect to a surface of the substrate that is less than ninety degrees and greater than zero degrees.

10 Claims, 9 Drawing Sheets

METHOD OF FORMING A MEMORY CELL BY REDUCING DIFFUSION OF DOPANTS UNDER A GATE

FIELD OF THE INVENTION

The present invention relates to a non-volatile flash memory cell which has a select gate, a floating gate, a control gate, and an erase gate having a specific doping in the substrate underneath the select gate. The present invention also relates to an array of such flash memory cells, and methods of manufacturing such cell and array.

BACKGROUND OF THE INVENTION

Split gate non-volatile flash memory cells having a select gate, a floating gate, a control gate and an erase gate are well known in the art. See for example U.S. Pat. Nos. 6,747,310, 7,868,375 and 7,927,994, and published application 2011/0127599, which are all incorporated herein by reference in their entirety for all purposes. Such split gate memory cells include a channel region in the substrate that extends between the source and drain. The channel region has a first portion underneath the floating gate (hereinafter called the FG channel, the conductivity of which is controlled by the floating gate), and a second portion underneath the select gate (hereinafter the WL channel, the conductivity of which is controlled by the select gate).

In order to increase read performance, the thickness of the oxide layer under the select gate is minimized. However, reducing this oxide layer thickness needs to be accompanied by an increase in P-type doping in the select gate channel region, in order to maintain desired target word line threshold voltage. One solution may be to implant a P-type dopant into the WL channel portion of the channel region (under the select gate). This could be done by performing a P-type implant step after the floating gate and control gate have been formed but before the select gate is formed, so that only the WL channel portion of the channel region will receive the increased doping by the implant step.

However, during subsequent thermal cycles, dopant implanted into the WL channel inevitably diffuses laterally into the FG channel, causing a local increase in the FG transistor threshold on the side closest to the select gate. FIG. 1 illustrates one example of P-type dopant distribution within a split gate cell. As seen in FIG. 1, the dopant distribution in the FG channel (underneath the floating gate) is not uniform, which is undesirable because it can make it more difficult to turn on the heavily doped portion of the FG channel and to turn off the lightly doped portion of the FG channel.

BRIEF SUMMARY OF THE INVENTION

A method of forming a memory cell that addresses the above described issues includes providing a substrate of semiconductor material of a first conductivity type, forming first and second spaced-apart regions in the substrate of a second conductivity type, with a channel region therebetween, forming a conductive floating gate over and insulated from the substrate, forming a conductive control gate over and insulated from the floating gate, forming a conductive erase gate laterally to one side of, and insulated from, the floating gate, forming a conductive select gate laterally to an opposite side of the one side of, and insulated from, the floating gate, and implanting, after the forming of the floating gate and the select gate, a dopant into a portion of the channel region underneath the select gate using an implant process that injects the dopant at an angle with respect to a surface of the substrate that is less than ninety degrees and greater than zero degrees.

Other objects and features of the present invention will become apparent by a review of the specification, claims and appended figures.

DETAILED DESCRIPTION OF THE INVENTION

The present invention solves the aforementioned problems by implanting dopant into the WL channel region after the formation of the select gate using an angled implant process, thereby more effectively providing an increased dopant level in the WL channel region with minimal diffusion into the FG channel region.

Figure 1:
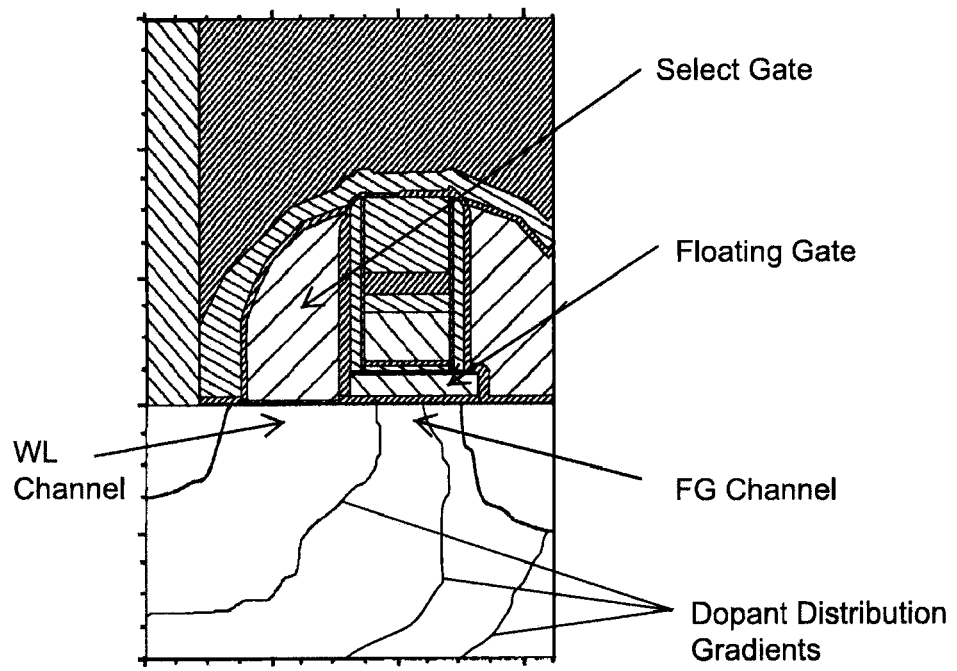
FIG. 1 is a side cross sectional view of a memory cell illustrating the P-type dopant distribution in the substrate below the cell.
Figure 2:
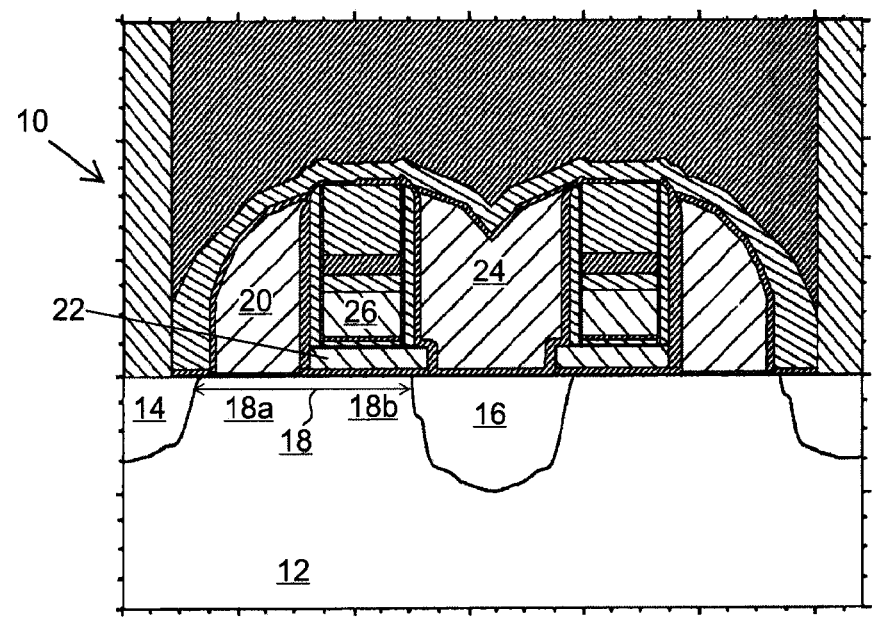
FIG. 2 is a side cross sectional view of a memory cell of the type that can benefit from the techniques of the present invention.

FIG. 2 illustrates a cross-sectional view of a non-volatile memory cell 10 formed by the techniques of the present invention. While the memory cell of FIG. 2 is exemplary of the type that can benefit from the techniques of the present invention, it is only one example and should not be deemed to be limiting. The memory cell 10 is made in a substantially single crystalline substrate 12, such as single crystalline silicon, which is of P conductivity type. Within the substrate 12 is a region 14 of a second conductivity type. If the first conductivity type is P then the second conductivity type is N. Spaced apart from region 14 is another region 16 of the second conductivity type. Between the regions 14 and 16 is a channel region 18, which provides for the conduction of charges between region 14 and region 16.

Positioned above, and spaced apart and insulated from the substrate 12 is a select gate 20, also known as the word line 20. The select gate 20 is positioned over a first portion of the channel region 18 (i.e. the WL channel portion 18a). The WL channel portion 18a of the channel region 18 immediately abuts the region 14. Thus, the select gate 20 has little or no overlap with the region 14. A floating gate 22 is also positioned above and is spaced apart and is insulated from the substrate 12. The floating gate 22 is positioned over a second portion of the channel region 18 (i.e. the FG channel portion 18b) and a portion of the region 16. The FG channel portion 18b of the channel region 18 is distinct from the WL channel portion 18a of the channel region 18. Thus, the floating gate 22 is laterally spaced apart and is insulated from and is adjacent to the select gate 20. An erase gate 24 is positioned over and spaced apart from the region 16, and is insulated from the substrate 12. The erase gate 24 is laterally insulated and spaced apart from the floating gate 22. The select gate 20 is to one side of the floating gate 22, with the erase gate 24 to another side of the floating gate 22. Finally, positioned above the floating gate 22 and insulated and spaced apart therefrom is a control gate 26. The control gate 26 is positioned between and insulated from the erase gate 24 and the select gate 20.

Figure 3A:
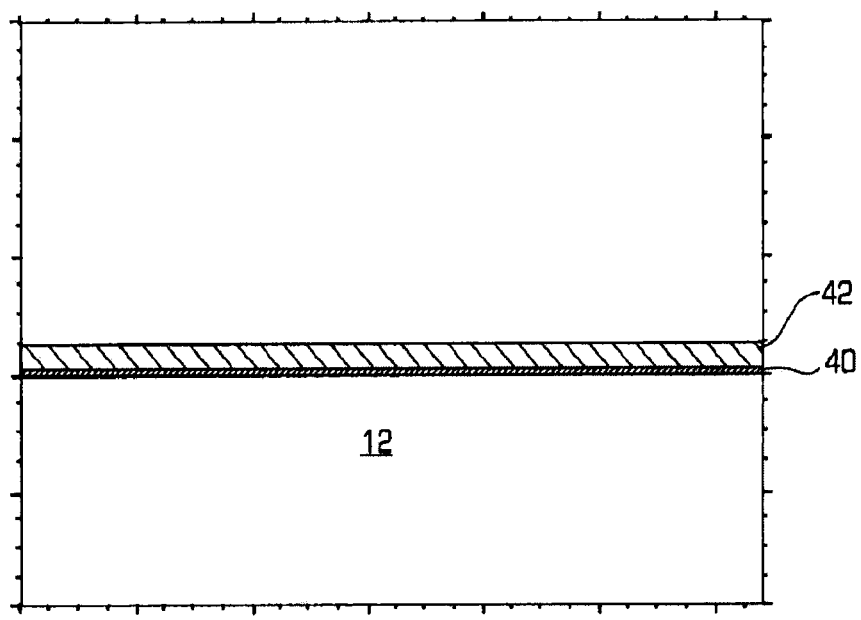
FIGS. 3A to 3M are side cross sectional views illustrating the steps in the process to make a non-volatile memory cell according the present invention.

FIGS. 3A-3M illustrate cross-sectional views of the steps in the process to make the non-volatile memory cell 10. Commencing with FIG. 3A, there is shown the formation of a layer of silicon dioxide 40 on a substrate 12 of P type single crystalline silicon. The layer 40 of silicon dioxide can be on the order of 80-110 angstroms. Thereafter a first layer 42 of polysilicon (or amorphous silicon) is deposited or formed on the layer 40 of silicon dioxide. The first layer 42 of polysilicon can be on the order of 300-800 angstroms. The first layer 42 of polysilicon is subsequently patterned in a direction perpendicular to the select gate 20.

Figure 3B:
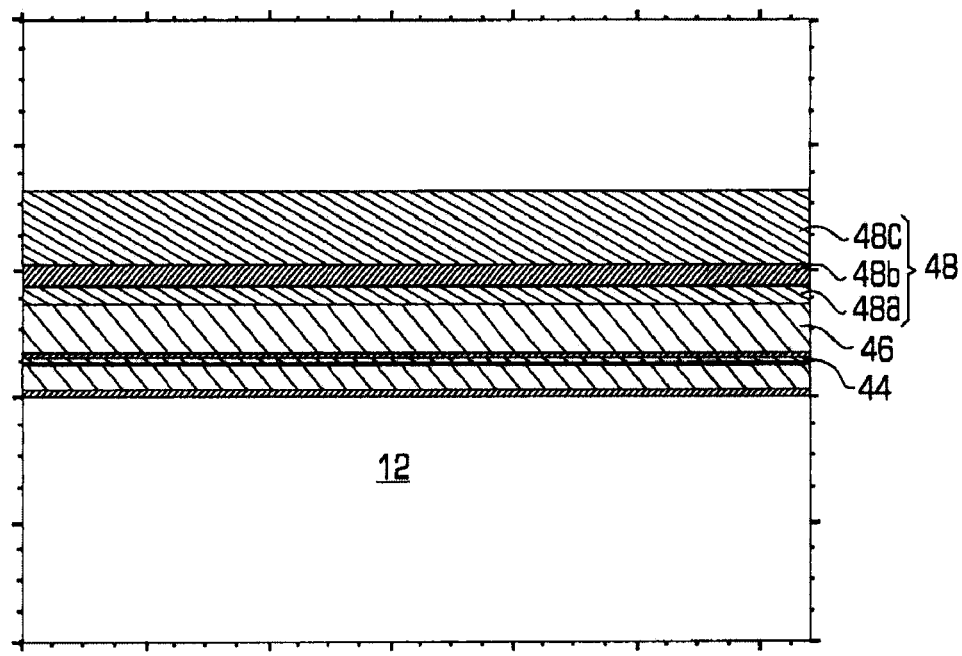

Referring to FIG. 3B, another insulating layer 44, such as silicon dioxide (or even a composite layer, such as ONO) is deposited or formed on the first layer 42 of polysilicon. Depending on whether the material is silicon dioxide or ONO, the layer 44 can be on the order of 100-200 angstroms. A second layer 46 of polysilicon is then deposited or formed on the layer 44. The second layer 46 of polysilicon can be on the order of 500-4000 angstroms thick. Another layer 48 of insulator is deposited or formed on the second layer 46 of polysilicon and used as a hard mask during subsequent dry etching. In a preferred embodiment, the layer 48 is a composite layer, comprising silicon nitride 48a, silicon dioxide 48b, and silicon nitride 48c, where the dimensions can be 200-600 angstroms for layer 48a, 200-600 angstroms for layer 48b, and 500-3000 angstroms for layer 48c.

Figure 3C:
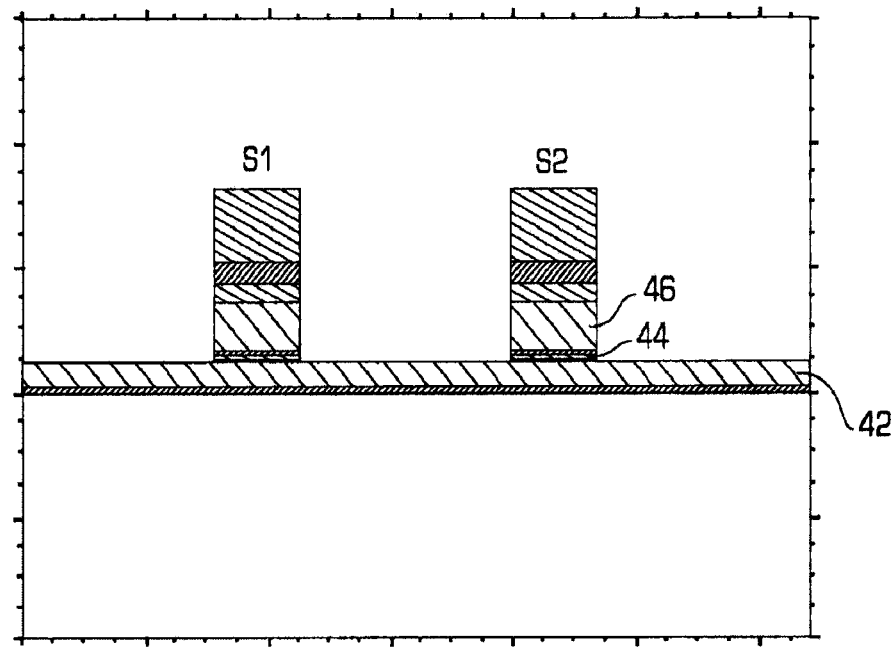

Referring to FIG. 3C, photoresist material (not shown) is deposited on the structure shown in FIG. 3B, and a masking step is formed exposing selected portions of the photoresist material. The photoresist is developed and using the photoresist as a mask, the structure is etched. The composite layer 48, the second layer 46 of polysilicon, the insulating layer 44 are then anisotropically etched, until the first layer 42 of polysilicon is exposed. The resultant structure is shown in FIG. 3C. Although only two "stacks": S1 and S2 are shown, it should be clear that there are number of such "stacks" that are separated from one another.

Figure 3D:
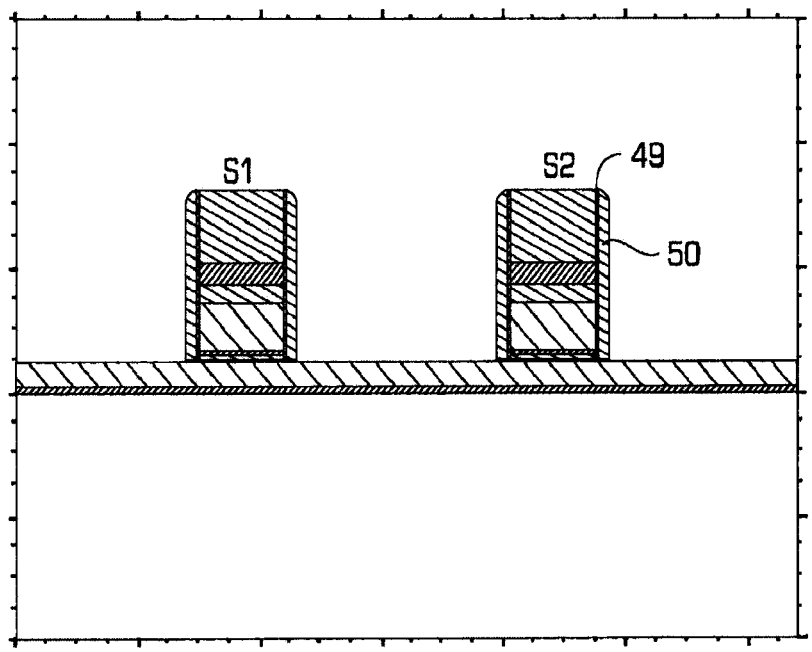

Referring to FIG. 3D, silicon dioxide 49 is deposited or formed on the structure. This is followed by the deposition of silicon nitride layer 50. The silicon dioxide 49 and silicon nitride 50 are anisotropically etched leaving a spacer 51 (which is the combination of the silicon dioxide 49 and silicon nitride 50) around each of the stacks S1 and S2. The resultant structure is shown in FIG. 3D.

Figure 3E:
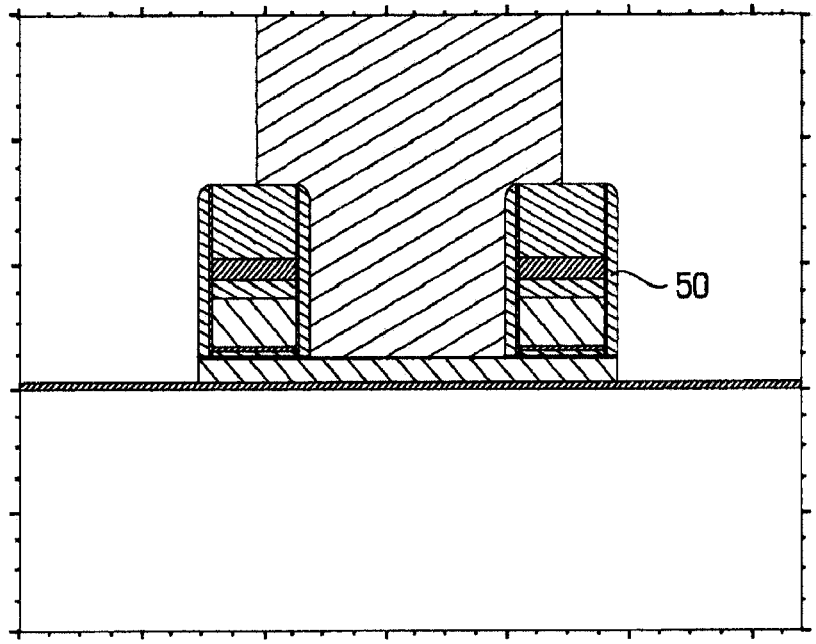

Referring to FIG. 3E, a photoresist mask is formed over the regions between the stacks S1 and S2, and other alternating pair stacks. For the purpose of this discussion, this region between the stacks S1 and S2 will be called the "inner region" and the regions not covered by the photoresist, shall be referred to as the "outer regions". The exposed first polysilicon 42 in the outer regions is anisotropically etched. The oxide layer 40 may be left intact, or it may be partially or completely anisotropically etched. The resultant structure is shown in FIG. 3E.

Figure 3F:
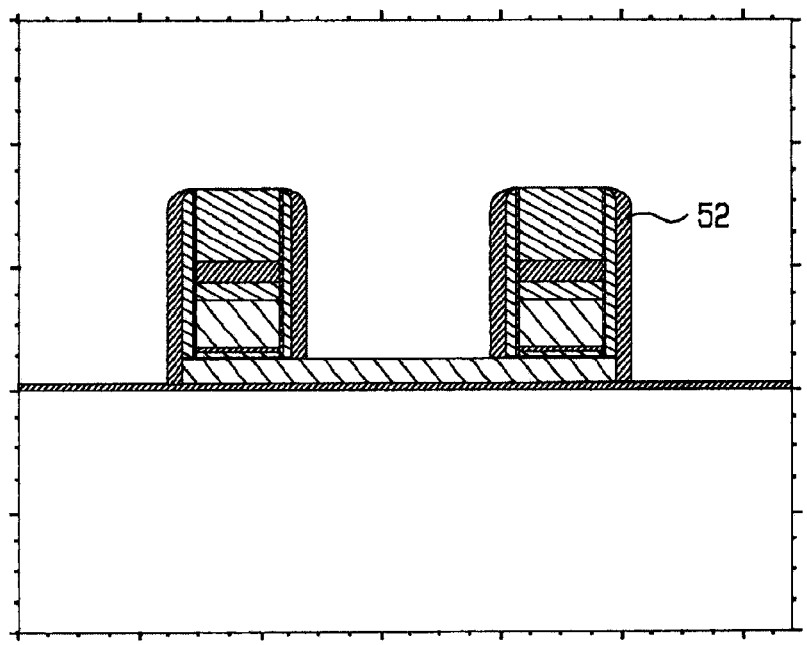

Referring to FIG. 3F, the photoresist material is removed from the structure shown in FIG. 3E. A layer of oxide 52 is then deposited or formed. The oxide layer 52 is then subject to an anisotropical etch leaving spacers 52, adjacent to the stacks S1 and S2. The resultant structure is shown in FIG. 3F.

Figure 3G:
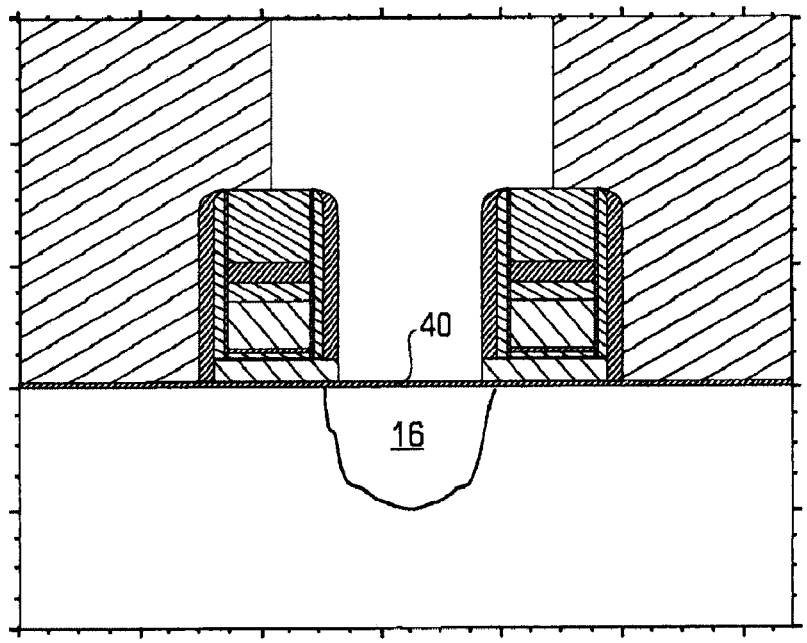

Referring to FIG. 3G, photoresist material is then deposited and is masked leaving openings in the inner regions between the stacks S1 and S2. Again, similar to the drawing shown in FIG. 3E, the photoresist is between other alternating pairs of stacks. The polysilicon 42 in the inner regions between the stacks S1 and S2 (and other alternating pairs of stacks) is anisotropically etched. The silicon dioxide layer 40 beneath the polysilicon 42 may be left intact, or it may be partially or completely anisotropically etched. The resultant structure is subject to a high voltage ion implant forming the regions 16. The resultant structure is shown in FIG. 3G.

Figure 3H:
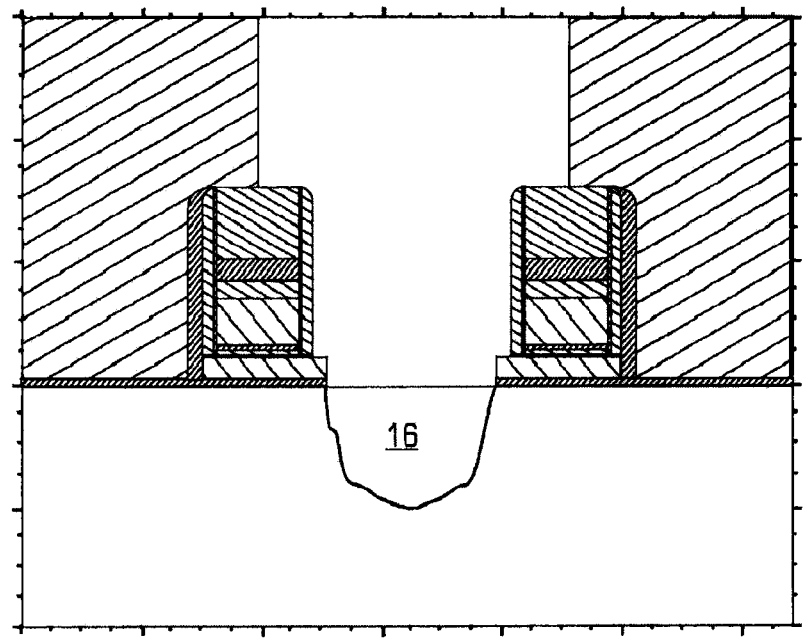
Figure 3I:
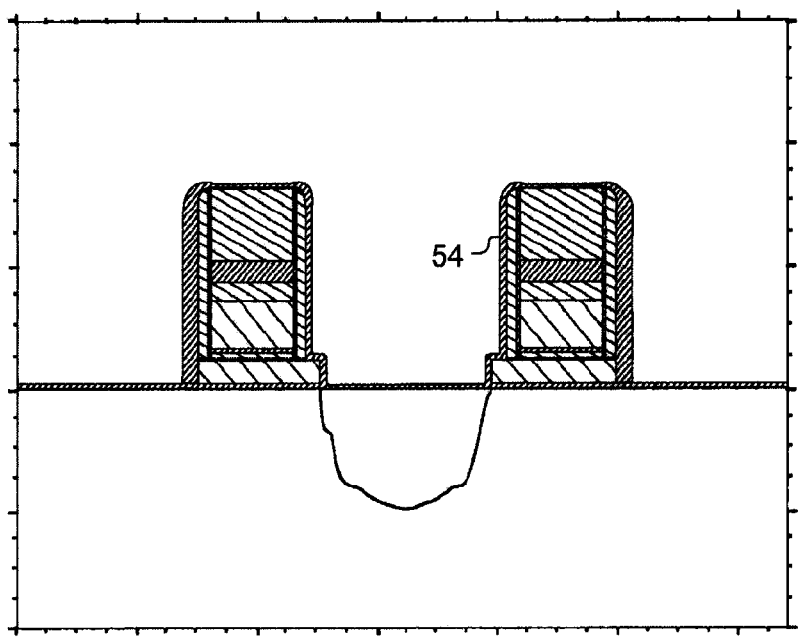

Referring to FIG. 3H, the oxide spacer 52 adjacent to the stacks S1 and S2 in the inner region is removed by e.g. a wet etch or a dry isotropic etch. Referring to FIG. 3I, the photoresist material in the outer regions of the stacks S1 and S2 is removed. Silicon dioxide layer 54, on the order of 100-200 Angstroms, is deposited or formed everywhere. The resultant structure is shown in FIG. 3I.

Figure 3J:
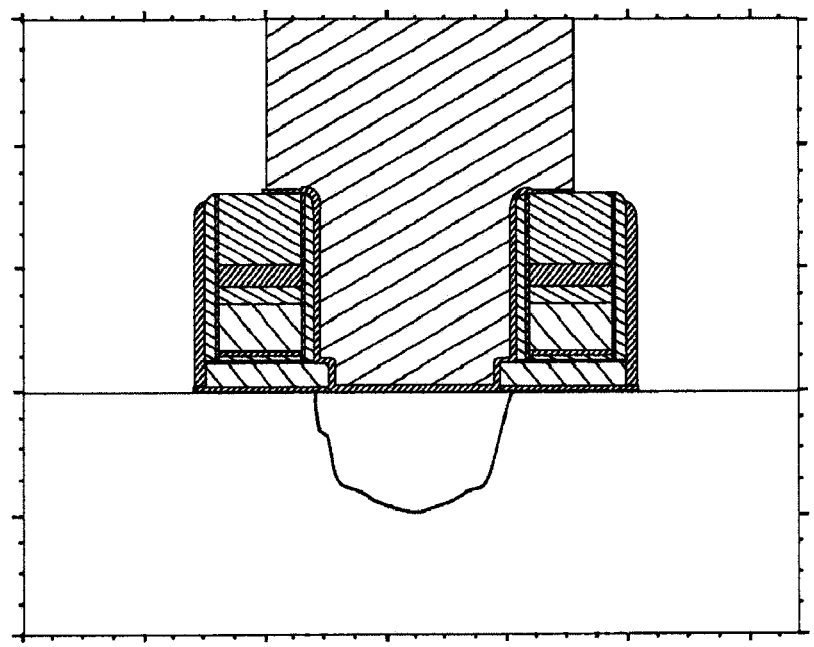

Referring to FIG. 3J, the structure is once again covered by photoresist material and a masking step is performed exposing the outer regions of the stacks S1 and S2 and leaving photoresist material covering the inner region between the stacks S1 and S2. An oxide anisotropical etch is performed, to reduce the thickness of the spacer 54 in the outer regions of the stack S1 and S2, and to completely remove silicon dioxide from the exposed silicon substrate 12 in the outer regions. The resultant structure is shown in FIG. 3J.

Figure 3K:
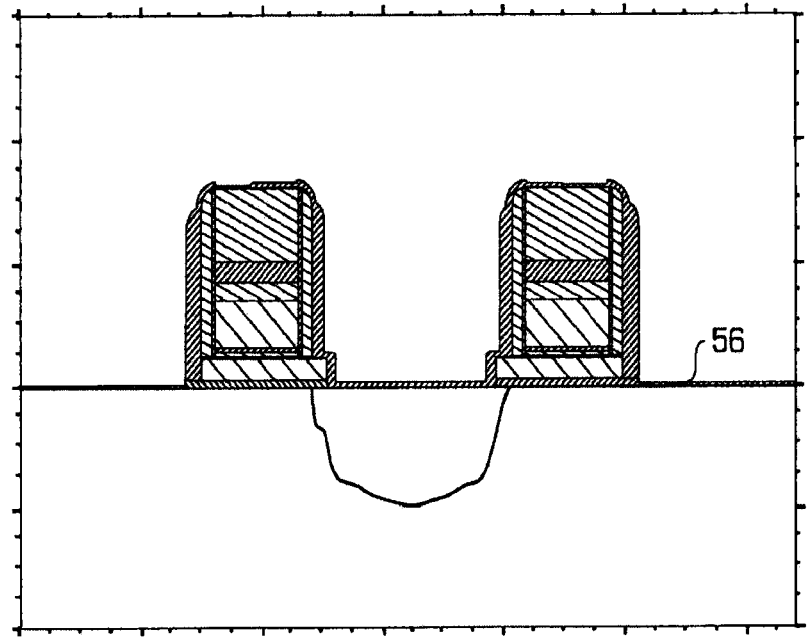

Referring to FIG. 3K, a thin layer 56 of silicon dioxide, on the order of 10-100 angstroms, is formed on the structure. This oxide layer 56 is the gate oxide between the select gate and the substrate 12, and the reduction of its thickness to increase read performance resulted in the discovery of the present invention. The resultant structure is shown in FIG. 3K.

Figure 3L:
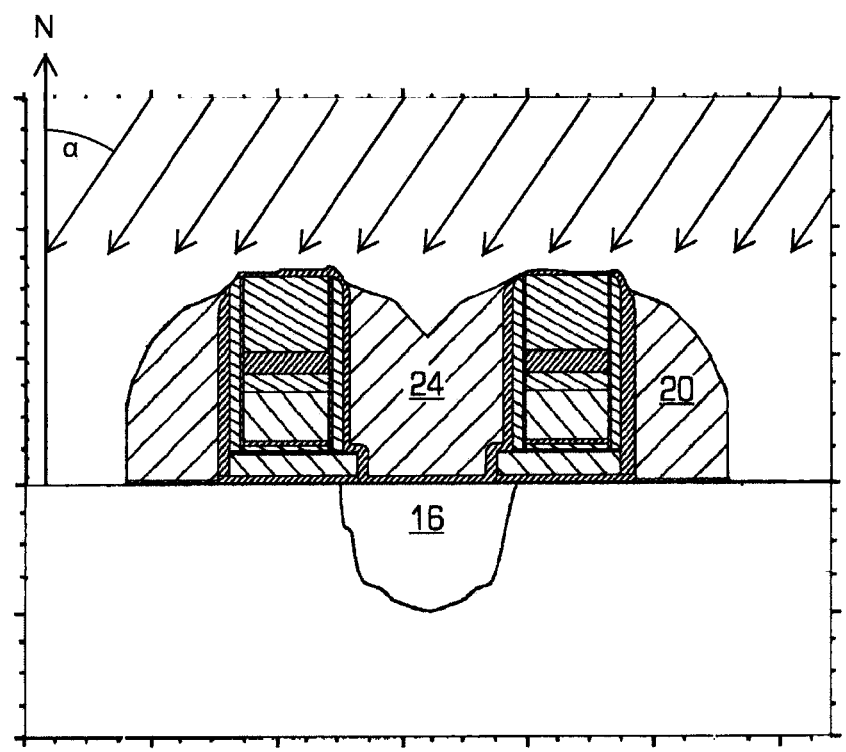

Referring to FIG. 3L, polysilicon 60 is deposited everywhere. The layer 60 of polysilicon is then subject to an anisotropical etch forming spacers in the outer regions of the stack S1 and S2 which form the select gates 20 of two memory cells 10 adjacent to one another sharing a common region 16. In addition, the spacers within the inner regions of the stacks S1 and S2 are merged together forming a single erase gate 24 which is shared by the two adjacent memory cells 10. An angled P-type implant is then performed (i.e. an implant performed at an angle less than 90 degrees relative to the substrate), which injects dopant in the substrate and therefore underneath the select gate 20, without the dopant reaching the substrate underneath the floating gate 22. The angle and energy of the implant is selected so that dopant atoms are injected into the WL channel region (18b) of the channel, without adversely affecting the FG Vt (the voltage needed to turn on the FG channel region of the channel under the floating gate). Examples of implant parameters includes B11, implanted at 15 KeV with a total dose of 4E13, at an angle α of generally 30° relative to a normal N to the substrate surface (i.e. normal N is a line perpendicular to the surface of the substrate). The angled implant can be split between several wafer rotational angles to ensure all WL channel portions are adequately implanted. For example, the angled implant can be performed four times with 90 degree rotation of the implant relative to the substrate, to cover both left and right facing memory cells. The resulting structure is shown in FIG. 3L.

Figure 3M:
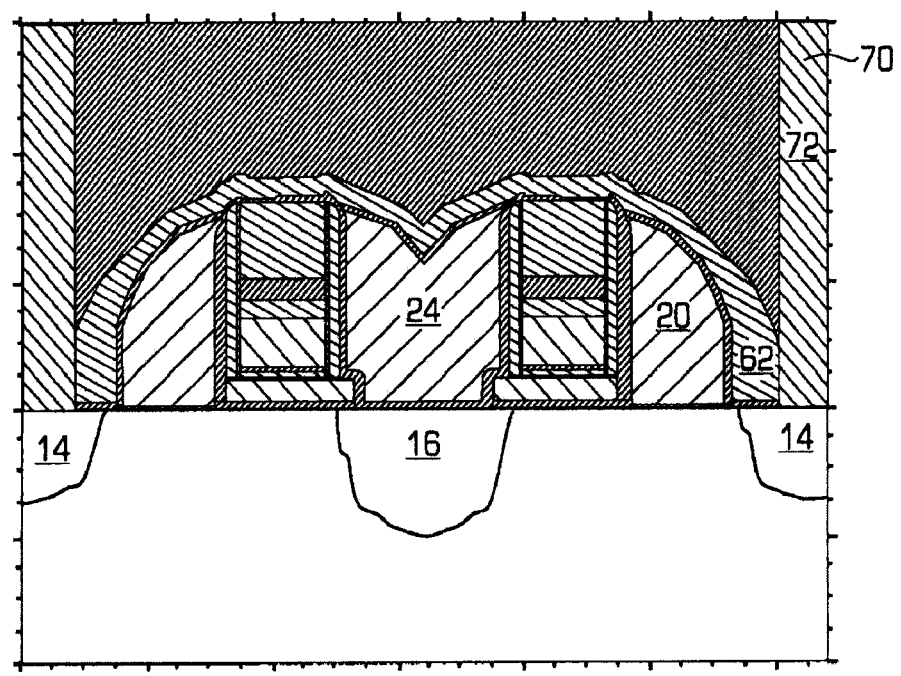

Referring to FIG. 3M, a layer of insulator 62 is deposited on the structure, and etched anisotropically to form spacers 62 next to the select gates 20. Insulator 62 can be a composite layer comprising silicon dioxide and silicon nitride. Thereafter, an ion implant step is performed forming the regions 14. Each of these memory cells on another side share a common region 14. Insulators and metallization layers are subsequently deposited and patterned to form bit line 70 and bit line contacts 72. The operations of program, read and erase and in particular the voltages to be applied may be the same as those as set forth in U.S. Pat. No. 6,747,310, whose disclosure has been incorporated herein by reference in its entirety. The resulting memory cells 10 are illustrated in FIG. 3M.

Depositing dopant into the WL channel portion using an angled implant procedure after the formation of all the gates (and after the formation of the select gates in particular) provides many advantages. First, implanted dopants are initially located far away from the FG channel, minimizing the likelihood of lateral diffusion of dopants into the FG channel portion. Second, it minimizes thermal cycles performed after the implant, further reducing lateral diffusion of dopant toward the FG channel portion. By preserving low doping in the FG channel portion, a lower and more uniform FG Vt (channel turn on voltage) results, which provides a better on/off read current window, better endurance, simplified retention screen testing, and lower manufacturing cost.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a memory cell, comprising:
providing a substrate of semiconductor material of a first conductivity type;
forming first and second spaced-apart regions in the substrate of a second conductivity type, with a channel region therebetween;
forming a conductive floating gate over and insulated from the substrate;
forming a conductive control gate over and insulated from the floating gate;
forming a conductive erase gate laterally to one side of, and insulated from, the floating gate;
forming a conductive select gate laterally to an opposite side of the one side of, and insulated from, the floating gate; and
implanting, after the forming of the floating gate and the select gate, a dopant into a portion of the channel region underneath the select gate using an implant process that injects the dopant at an angle with respect to a surface of the substrate that is less than ninety degrees and greater than zero degrees.

2. The method of claim 1, wherein the dopant is not implanted into a portion of the channel region underneath the floating gate.

3. The method of claim 1, wherein the dopant is of the first conductivity type.

4. The method of claim 1, wherein the dopant includes boron.

5. The method of claim 1, wherein the angle with respect to a normal N to the surface of the substrate is generally 30°.

6. The method of claim 1, wherein the dopant is injected with an implant energy of 15 KeV.

7. The method of claim 1, wherein the dopant is injected with a total dose of 4E13.

8. The method of claim 1, further comprising:
horizontally rotating the substrate 90 degrees; and
repeating the implanting for a second time.

9. The method of claim 8, further comprising:
after the implanting for a second time, horizontally rotating the substrate another 90 degrees; and
repeating the implanting for a third time.

10. The method of claim 9, further comprising:
after the implanting for a third time, horizontally rotating the substrate another 90 degrees; and
repeating the implanting for a fourth time.

* * * * *